United States Patent
Yamaoka et al.

(10) Patent No.: US 7,646,062 B2
(45) Date of Patent: Jan. 12, 2010

(54) SEMICONDUCTOR DEVICE COMPRISING BURIED WIRING LAYER

(75) Inventors: Yoshikazu Yamaoka, Ogaki (JP); Satoru Shimada, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/770,337

(22) Filed: Jun. 28, 2007

(65) Prior Publication Data

US 2008/0001214 A1    Jan. 3, 2008

(30) Foreign Application Priority Data

Jun. 29, 2006   (JP) .............................. 2006-179119
May 29, 2007   (JP) .............................. 2007-141961

(51) Int. Cl.
| | |
|---|---|
| H01L 27/01 | (2006.01) |
| H01L 27/12 | (2006.01) |
| H01L 27/10 | (2006.01) |
| H01L 29/73 | (2006.01) |
| H01L 29/74 | (2006.01) |
| H01L 27/148 | (2006.01) |
| H01L 29/749 | (2006.01) |
| H01L 29/768 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 23/48 | (2006.01) |
| H01L 23/52 | (2006.01) |
| H01L 29/40 | (2006.01) |

(52) U.S. Cl. .................. 257/349; 257/207; 257/208; 257/211; 257/216; 257/328; 257/335; 257/758; 257/759; 257/760; 257/E21.531

(58) Field of Classification Search ......... 257/207–208, 257/211, 328, 335, 758–760, 216, 349, E21.531
See application file for complete search history.

(56) References Cited

U.S. PATENT DOCUMENTS

| | | | | |
|---|---|---|---|---|
| 4,763,181 | A | * | 8/1988 | Tasch, Jr. .................... 257/300 |
| 4,969,022 | A | * | 11/1990 | Nishimoto et al. .......... 257/301 |
| 5,200,639 | A | * | 4/1993 | Ishizuka et al. ............. 257/508 |
| 5,453,640 | A | * | 9/1995 | Kinoshita ................... 257/520 |
| 5,574,299 | A | * | 11/1996 | Kim .......................... 257/296 |
| 5,872,044 | A | * | 2/1999 | Hemmenway et al. ...... 438/426 |

(Continued)

FOREIGN PATENT DOCUMENTS

JP         60010754 A         1/1985

(Continued)

*Primary Examiner*—Ida M Soward
(74) *Attorney, Agent, or Firm*—Ditthavong, Mori & Steiner, P.C.

(57) ABSTRACT

A semiconductor device that suppresses partial discharging to a semiconductor substrate caused by local concentration of current. The semiconductor device includes a semiconductor substrate, a gate electrode buried in the semiconductor substrate, a conductor buried in the semiconductor substrate further inward from the gate electrode, a wiring layer formed in the semiconductor substrate in connection with the conductor, and an insulation film arranged between the gate electrode and the conductor. The conductor is higher than the surface of the semiconductor substrate.

16 Claims, 14 Drawing Sheets

U.S. PATENT DOCUMENTS

| | | | | |
|---|---|---|---|---|
| 5,930,619 | A * | 7/1999 | Noble | 438/241 |
| 5,959,324 | A * | 9/1999 | Kohyama | 257/301 |
| 6,043,531 | A * | 3/2000 | Stecher et al. | 257/328 |
| 6,121,659 | A * | 9/2000 | Christensen et al. | 257/347 |
| 6,184,101 | B1 * | 2/2001 | Tsuzuki | 438/361 |
| 6,461,900 | B1 | 10/2002 | Sundaresan et al. | |
| 6,501,129 | B2 * | 12/2002 | Osawa | 257/330 |
| 6,507,085 | B2 * | 1/2003 | Shimizu | 257/502 |
| 6,645,796 | B2 * | 11/2003 | Christensen et al. | 438/149 |
| 6,696,724 | B2 * | 2/2004 | Verhaar | 257/314 |
| 6,717,210 | B2 * | 4/2004 | Takano et al. | 257/330 |
| 6,747,314 | B2 | 6/2004 | Sundaresan et al. | |
| 6,943,428 | B2 * | 9/2005 | Furukawa et al. | 257/587 |
| 7,067,870 | B2 * | 6/2006 | Omura et al. | 257/302 |
| 7,109,551 | B2 * | 9/2006 | Sugi et al. | 257/330 |
| 7,122,438 | B2 * | 10/2006 | Sasaki | 438/386 |
| 7,183,193 | B2 * | 2/2007 | Husher | 438/618 |
| 7,339,237 | B2 * | 3/2008 | Meyer | 257/349 |
| 2003/0170936 | A1 * | 9/2003 | Christensen et al. | 438/151 |
| 2003/0199156 | A1 * | 10/2003 | Fujii | 438/597 |
| 2004/0232522 | A1 * | 11/2004 | Shimizu | 257/548 |
| 2005/0110067 | A1 * | 5/2005 | Tanaka et al. | 257/301 |
| 2005/0191831 | A1 * | 9/2005 | Tagawa | 438/519 |
| 2005/0199953 | A1 * | 9/2005 | Kawamura et al. | 257/341 |
| 2006/0220099 | A1 * | 10/2006 | Kikuchi et al. | 257/315 |

FOREIGN PATENT DOCUMENTS

| | | | |
|---|---|---|---|
| JP | 6-97450 | | 4/1994 |
| JP | 2002-184980 | | 6/2002 |
| JP | 2002184980 A | * | 6/2002 |
| JP | 3348911 | | 9/2002 |
| JP | 2003-179160 A | | 6/2003 |
| JP | 2007-141961 | | 8/2008 |

* cited by examiner

Fig.1
Fig.1A
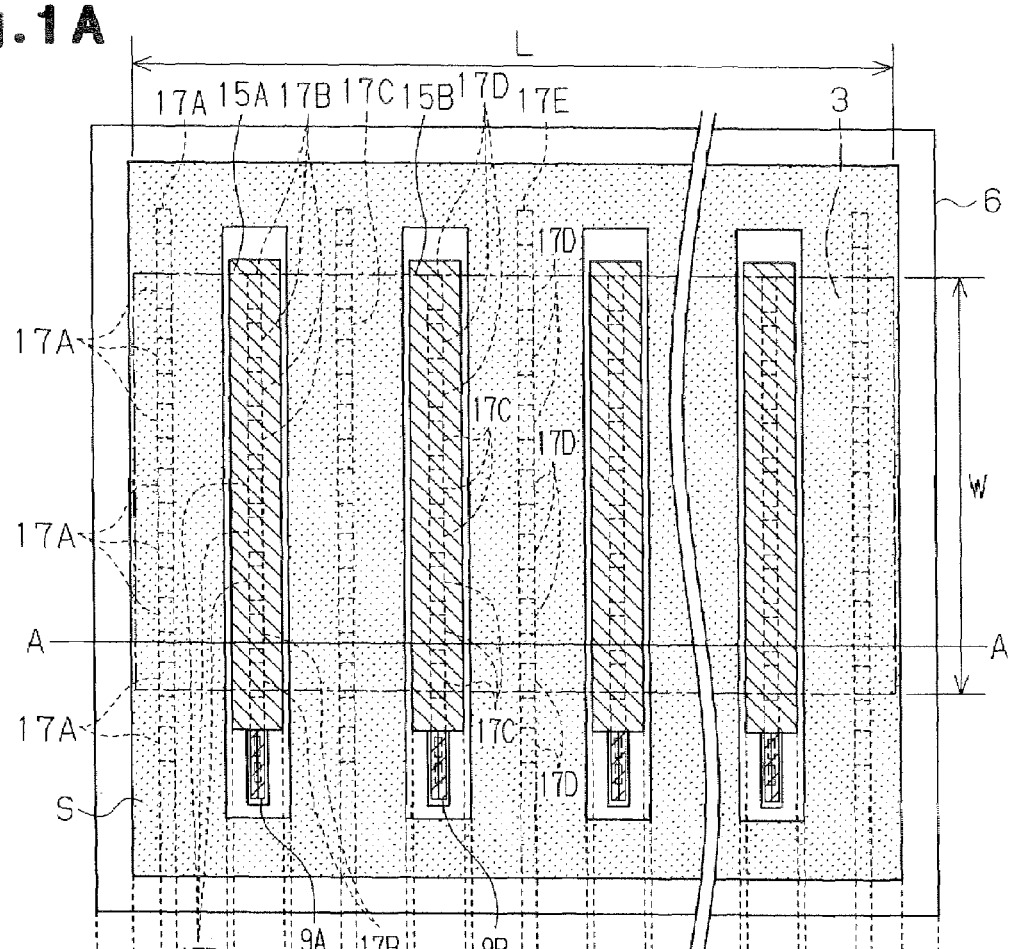
Fig.1B
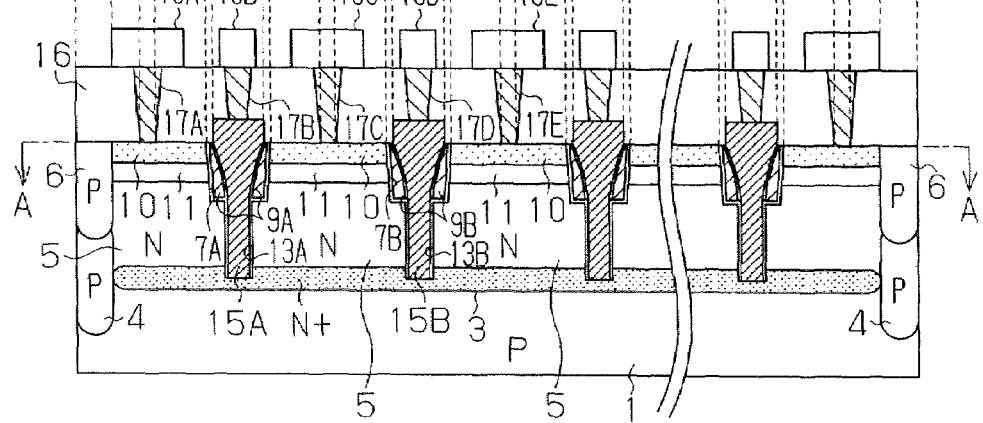

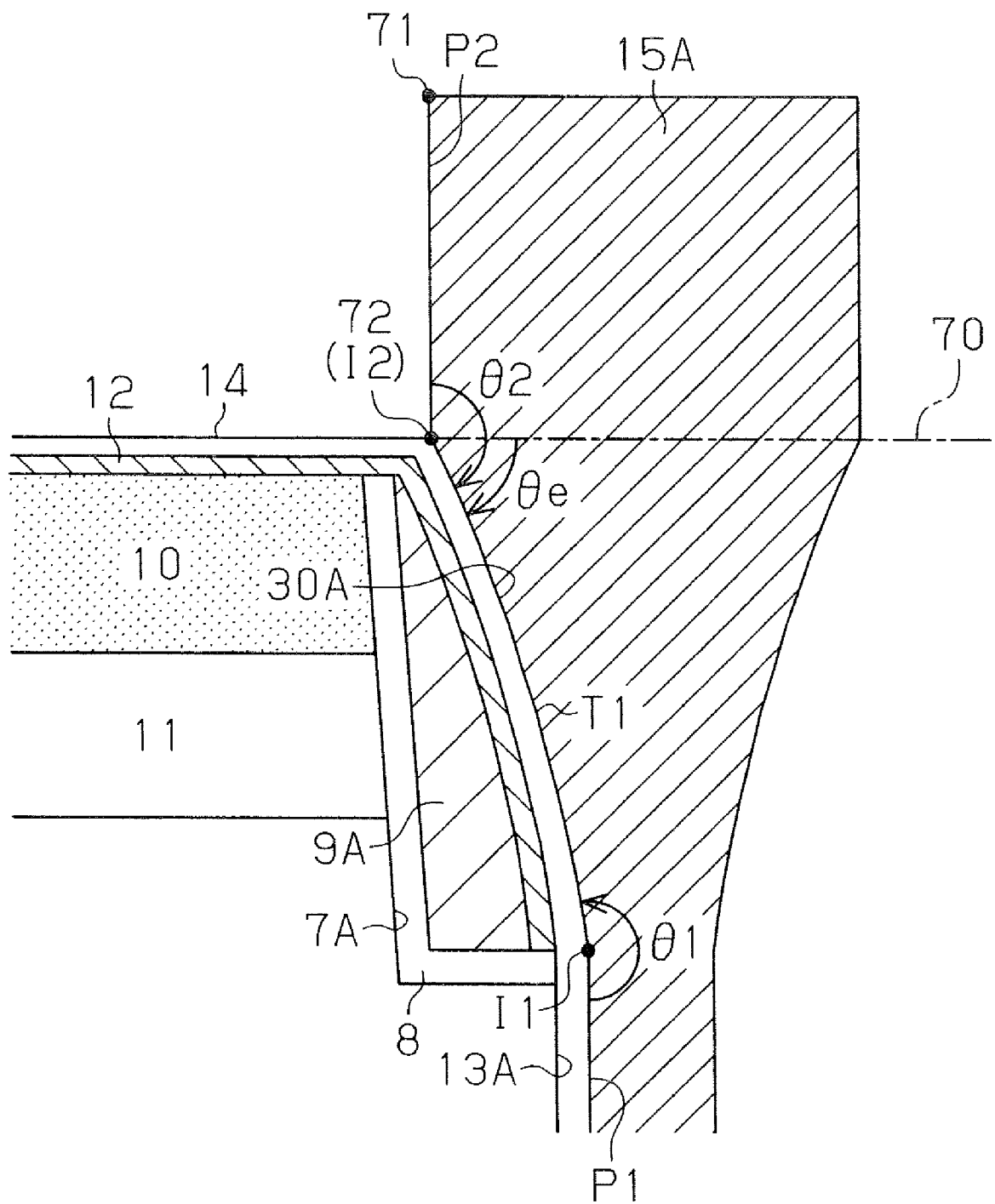

SEMICONDUCTOR DEVICE COMPRISING BURIED WIRING LAYER

CROSS-REFERENCE TO RELATED APPLICATIONS

This application is based upon and claims the benefit of priority from the prior Japanese Patent Applications No. 2006-179119, filed on Jun. 29, 2006, and No. 2007-141961, filed on May 29, 2007, the entire contents of which are incorporated herein by reference.

BACKGROUND OF THE INVENTION

The present invention relates to a semiconductor device, and more particularly, to a semiconductor device, which includes a plurality of power transistors, that has a structure enabling miniaturization and improves operational stability.

The size and cost of electronic devices have been reduced. This has resulted in a requirement for miniaturization of power transistors used in such electronic devices. In particular, electronic devices that operate at withstand voltages of 100 V and lower, such as portable devices and household appliances, are required to be further miniaturized. Such electronic devices must employ a technique for integrating a control circuit with a plurality of power transistors on the same semiconductor substrate. A lateral double diffused metal oxide semiconductor field effect transistor (hereafter "LDMOSFET"), which is a known transistor structure that facilitates integration of a plurality of semiconductor elements, is widely used.

An LDMOSFET normally has a drift region formed near its drain to increase the withstand voltage. The drift region is normally requires a length of about 0.067 μm/V. To manufacture, for example, an LDMOSFET having a withstand voltage of 20 V, a drift region having a length of about 1.34μ must be formed by using a submicron fabrication technique. In this manner, the withstand voltage of the LDMOSFET is increased by forming the drift region near the drain. However, the miniaturization of the LDMOSFET is limited by the existence of the drift region.

Japanese Patent No. 3348911 and Japanese Laid-Open Patent Publication No. 2002-184980 describe examples of transistor structures that solve such problems. In the DMOSFET structures described in these documents, a source wire and a drain wire extend from the surface of a semiconductor substrate, and a trench groove is formed in the semiconductor substrate extending in the depthwise direction. A gate electrode is arranged in the trench groove with an insulation film arranged in between. Further, a channel layer and a drift layer are formed in regions of the semiconductor substrate near the side walls of the trench groove. This miniaturizes the DMOS transistor.

The DMOSFET structures described in the above publications reduce the area of the semiconductor substrate occupied by each semiconductor element in comparison with the LDMOSFET structure. Normally, a plurality of power semiconductor elements are connected in parallel to drive a large load. However, reduction in the area occupied by each semiconductor element reduces regions for formation of metal wires that connect semiconductor elements or connect each semiconductor element to an external circuit. This reduces the wiring width of the metal wires and increases the wiring resistance of the metal wires, which lead to the problems described below.

The increased wiring resistance results in application of different voltages to the semiconductor elements although uniform voltage must be applied to the semiconductor elements. This would cause current to concentrate at particular portions of the semiconductor elements. The current concentration may lower the reliability of the semiconductor elements or shorten the lifetime of the wires with respect to fusion and electronic migration. Although the DMOSFET is less likely to have a secondary breakdown than a bipolar transistor, local concentration of current may inflict damages to a DMOSFET.

SUMMARY OF THE INVENTION

The present invention provides a semiconductor device and a method for manufacturing a semiconductor device that prevents local concentration of current from causing partial discharging to a semiconductor substrate.

One aspect of the present invention is a semiconductor device including a semiconductor substrate having a surface. A conductor is buried in the semiconductor substrate. A wiring layer is connected to the conductor in the semiconductor substrate. An insulation film is arranged between the semiconductor substrate and the conductor. The conductor has a part that is higher than the surface of the semiconductor substrate.

Another aspect of the present invention is a semiconductor device including a semiconductor substrate, a conductor buried in the semiconductor substrate, a wiring layer connected to the conductor in the semiconductor substrate, and an insulation film arranged between the semiconductor substrate and the conductor. The conductor has at least one first plane and at least one second plane that are alternately arranged adjacent to each other. The adjacent first and second planes form therebetween at least one inflection point at which the adjacent first and second planes are angled from each other at an obtuse angle.

A further aspect of the present invention is a semiconductor device including a semiconductor substrate having a surface. A gate electrode is buried in the semiconductor substrate. A conductor is buried in the semiconductor substrate further inward from the gate electrode. A wiring layer is connected to the conductor in the semiconductor substrate. An insulation film is arranged between the gate electrode and the conductor. The conductor has a part that is higher than the surface of the semiconductor substrate.

Another aspect of the present invention is a method for manufacturing a semiconductor device. The method includes preparing a semiconductor substrate having a surface, forming a wiring layer in the semiconductor substrate, and burying a conductor connected to the wiring layer in the semiconductor substrate with an insulation film arranged in between. The step of burying a conductor includes forming the conductor so that part of the conductor is higher than the surface of the semiconductor substrate.

A further aspect of the present invention is a method for manufacturing a semiconductor substrate. The method includes preparing a semiconductor substrate having a surface, forming a wiring layer in the semiconductor substrate, burying a gate electrode in the semiconductor substrate, and burying a conductor that extends through the gate electrode and connects to the wiring layer in the semiconductor substrate with an insulation film arranged in between. The step of burying a conductor includes forming the conductor so that part of the conductor is higher than the surface of the semiconductor substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic plane view showing a semiconductor device according to a first embodiment of the present invention, and FIG. 1B is a cross-sectional view taken along line A-A in FIG. 1A;

FIG. 13A is an enlarged view showing the region encircled by broken lines in FIG. 13;

DETAILED DESCRIPTION OF THE PREFERRED EMBODIMENTS

Figure 2:
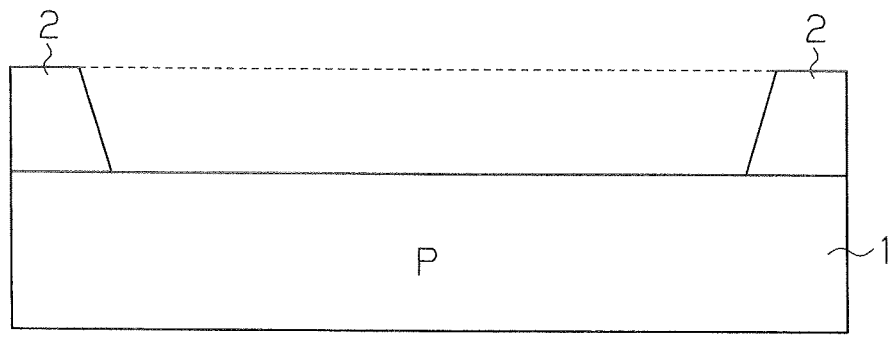
FIG. 2 is a schematic cross-sectional view showing a process for manufacturing the semiconductor device of FIG. 1A.

A semiconductor device according to a first embodiment of the present invention will now be described with reference to the drawings.

The structure of the semiconductor device according to the first embodiment will now be described in detail with reference to FIGS. 1A and 1B. FIG. 1A is a plane view showing the semiconductor device, and FIG. 1B is a cross-sectional view taken along line A-A in FIG. 1A.

As shown in FIG. 1A, the semiconductor device of the first embodiment includes a plurality of double diffused metal oxide semiconductor field effect transistors (hereafter referred to as "DMOSFETs") arranged in a semiconductor element formation region S surrounded by isolation diffusion layers 4 and 6. The semiconductor device may be used for example as a power transistor. The problem of the DMOSFET, which typically has a total gate length of as long as several millimeters, is in that it has a high wiring resistance. To solve this problem, the DMOSFETs are arranged to form a multi-finger structure in which their sources and drains are arranged alternately as shown in FIG. 1A. For the sake of brevity, FIG. 1A shows only four DMOSFETs in the formation region S. However, up to hundreds of DMOSFETs may be arranged in the formation region S.

As shown in FIG. 1B, the DMOSFETs are formed by forming an n-type buried diffusion layer 3 on a p-type silicon substrate 1 and an n-type epitaxial silicon layer 5 on the buried diffusion layer 3. In the first embodiment, the silicon substrate 1 and the epitaxial silicon layer 5 (including a body diffusion layer 11 and a source diffusion layer 10 described later) form a semiconductor substrate. The buried diffusion layer 3 is formed inside the semiconductor substrate. The buried diffusion layer 3 may be formed throughout the entire formation region S. The impurity content of the buried diffusion layer 3 is higher than the impurity content of the epitaxial silicon layer 5.

The p-type body diffusion layer 11 and the n-type source diffusion layer 10 are formed one by one on the epitaxial silicon layer 5. The body diffusion layer 11 and the source diffusion layer 10 are formed using portions of the epitaxial silicon layer 5 as will be described later. In the first embodiment, the surface of the semiconductor substrate refers to the surface of the source diffusion layer 10. Trench grooves 7A and 7B extend in parallel in the surface of the epitaxial silicon layer 5. Gate electrodes 9A and 9B are buried in the inner walls of the trench grooves 7A and 7B by means of insulation films made of, for example, silicon dioxide. As shown in FIG. 1A, the gate electrodes 9A and 9B are bonded to lower end portions of the trench grooves 7A and 7B. As indicated by broken lines in FIGS. 1A and 1B, conductive contact plugs 17B and 17D are arranged above the gate electrodes 9A and 9B. The contact plugs 17B and 17D are connected to gate electrode metal wires. The gate electrodes 9A and 9B are connected to metal wires 18B and 18D (FIG. 1B) via the contact plugs 17B and 17D.

As shown in FIG. 1B, grooves 13A and 13B, which extend downward from the trench grooves 7A and 7B to the buried diffusion layer 3, are formed in the epitaxial silicon layer 5. In the first embodiment, the trench groove 7A and the groove 13A form a single trench groove 30A, and the trench groove 7B and the groove 13B form a single trench groove 30B (refer to FIGS. 9 to 13). Drain lead electrodes 15A and 15B are formed in the trench grooves 30A and 30B. The drain lead electrodes 15A and 15B are connected to the buried diffusion layer 3. The drain lead electrodes 15A and 15B are formed in a manner that their upper portions are located above the surface of the semiconductor substrate, that is, the surface of the source diffusion layer 10.

An interlayer insulation film 16 is formed on the source diffusion layer 10. Contact plugs 17A, 17C, and 17E, which are connected to the source diffusion layer 10, and contact plugs 17B and 17D, which are connected to the drain lead electrodes 15A and 15B, are buried in the interlayer insulation film 16. Metal wires 18A to 18E, which are connected to the contact plugs 17A to 17E, are formed on the interlayer insulation film 16.

The DMOSFETs having the above-described structure include the current flow path described below.

Carriers injected from the metal wire 18A flow into the buried diffusion layer 3 through channels formed in the source diffusion layer 10 and the body diffusion layer 11. The carriers flowing into the buried diffusion layer 3 flow into the metal wire 18B through the drain lead electrode 15A and the contact plug 17B. Carriers injected from the metal wires 18C and 18E flow into the buried diffusion layer 3 through channels formed in the source diffusion layer 10 and the body diffusion layer 11. The carriers flowing into the buried diffusion layer 3 flow into the metal wires 18B and 18D through the drain lead electrode 15A or 15B and the contact plugs 17B and 17D.

When the buried diffusion layer 3 are formed along a plane extending throughout the entire DMOSFET formation region S, the wiring resistance of each DMOSFET is reduced as compared with the conventional semiconductor device. As a result, variations in the wiring resistance of each DMOSFET are suppressed. This consequently suppresses biased current distribution in the DMOSFETs and prevents current from being concentrated at particular portions of the semiconductor device.

The processes for manufacturing the semiconductor device of the first embodiment will now be described with reference to FIGS. 2 to 12. The manufacturing of a semiconductor device including two DMOSFETs will be used to facilitate description.

[1] As shown in FIG. 2, a thermal oxidation film 2 is first formed on an upper surface of a silicon substrate 1. A portion of the thermal oxidation film 2 is then removed as indicated by the broken line in FIG. 2 by performing photolithography and wet etching.

Figure 3:
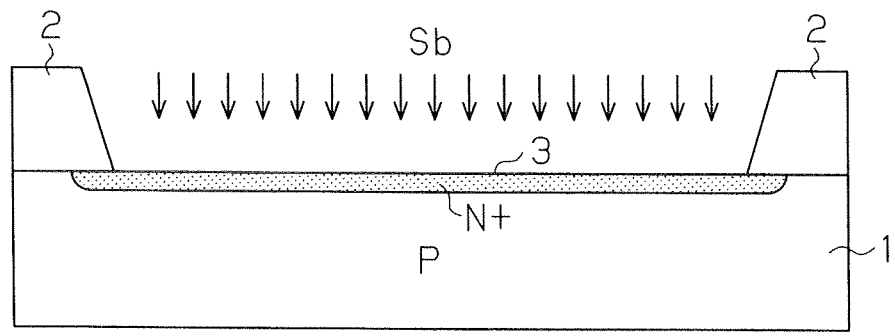
FIG. 3 is a schematic cross-sectional view showing the process for manufacturing the semiconductor device of FIG. 1A.
Figure 4:
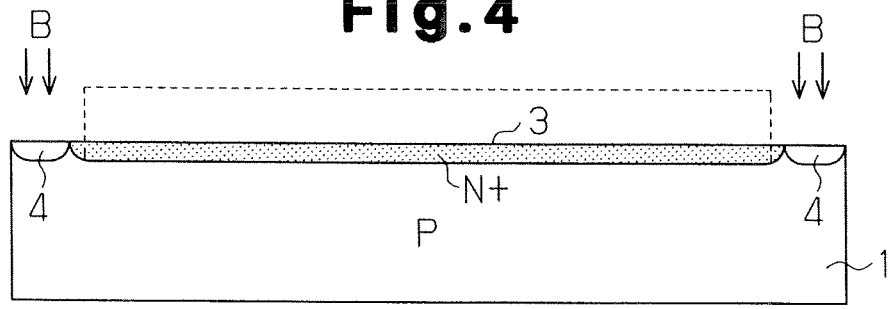
FIG. 4 is a schematic cross-sectional view showing the process for manufacturing the semiconductor device of FIG. 1A.

[2] As shown in FIG. 3, an antimony (Sb) source is applied to an upper surface region surrounded by the thermal oxidation film 2. The antimony source is applied by performing spin coating in a direction indicated by the arrows. The silicon substrate 1 is then subjected to heat treatment to form a buried diffusion layer 3.

[3] The thermal oxidation film 2 is removed. Then, a mask covering an upper surface of the buried diffusion layer 3 as indicated by the broken lines in FIG. 4 by performing photolithography. Boron (B) is ion-implanted into an upper surface of the silicon substrate 1 in a direction indicated by arrows in FIG. 4. The boron is activated by a heat treatment. This forms an isolation diffusion layer 4 surrounding the buried diffusion layer 3.

Figure 5:
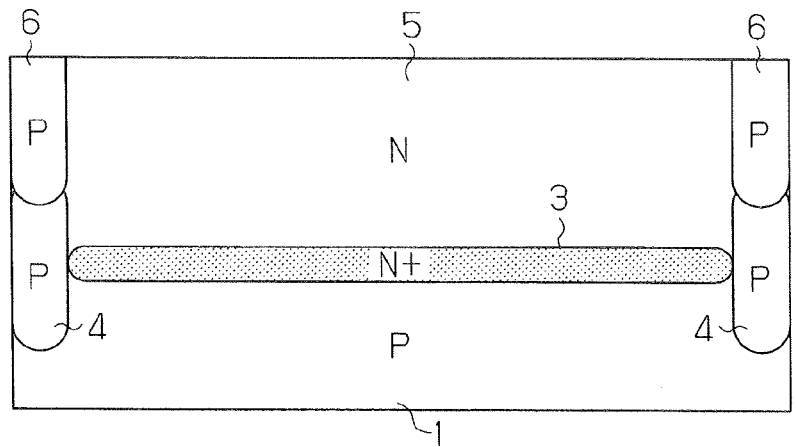
FIG. 5 is a schematic cross-sectional view showing the process for manufacturing the semiconductor device of FIG. 1A.

[4] As shown in FIG. 5, an n-type epitaxial silicon layer 5 is formed on the buried diffusion layer 3. Boron is then ion-implanted into a predetermined region of the epitaxial silicon layer 5, and the boron is activated by a heat treatment. This forms an isolation diffusion layer 6 that reaches the isolation diffusion layer 4. The isolation diffusion layer 4 and the isolation diffusion layer 6 define the epitaxial silicon layer 5.

Figure 6:
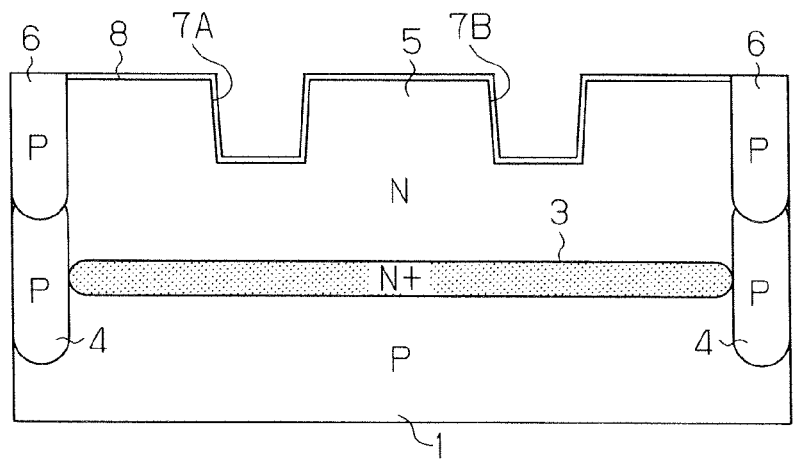
FIG. 6 is a schematic cross-sectional view showing the process for manufacturing the semiconductor device of FIG. 1A.

[5] As shown in FIG. 6, trench grooves 7A and 7B are formed in an upper surface portion of the n-type epitaxial silicon layer 5 by performing photolithography and etching. An upper surface of the epitaxial silicon layer 5 is thermally oxidized to form a gate insulation film 8.

Figure 7:
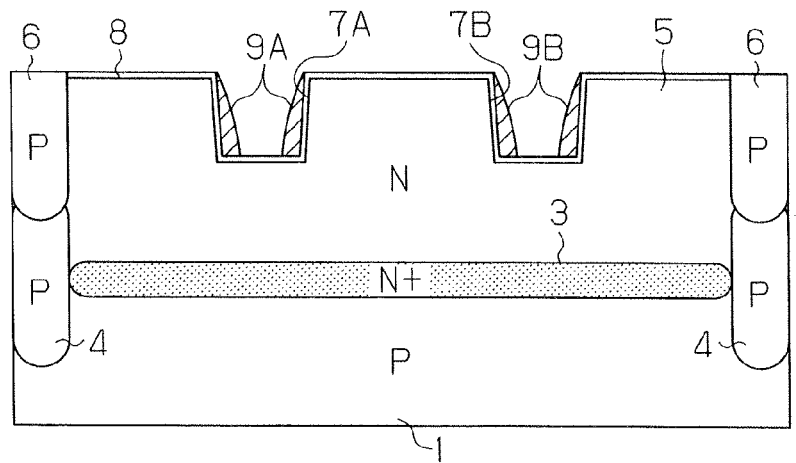
FIG. 7 is a schematic cross-sectional view showing the process for manufacturing the semiconductor device of FIG. 1A.

[6] Polysilicon is deposited inside the trench grooves 7A and 7B, and the polysilicon is doped with phosphorous (P). Referring to FIG. 7, anisotropic RIE (reactive ion etching) is performed to form gate electrodes 9A and 9B on the inner side walls of the trench grooves 7A and 7B.

Figure 8:
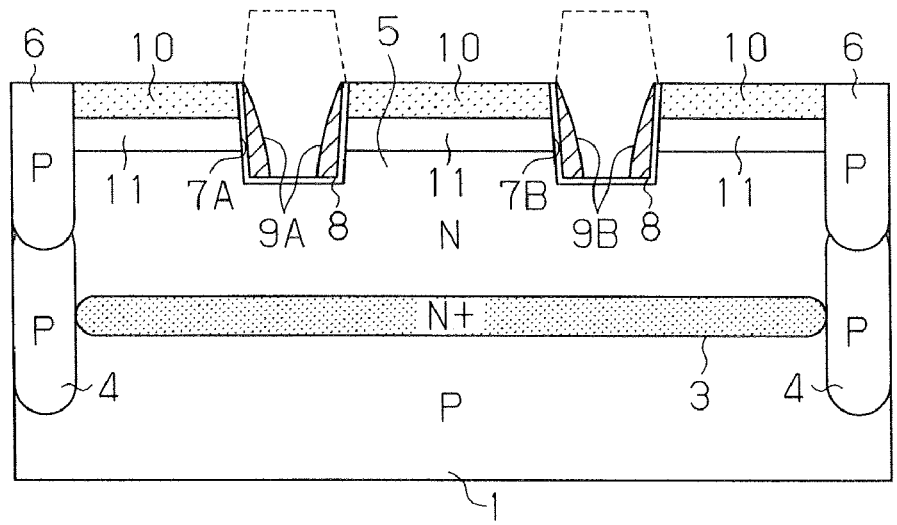
FIG. 8 is a schematic cross-sectional view showing the process for manufacturing the semiconductor device of FIG. 1A.
Figure 9:
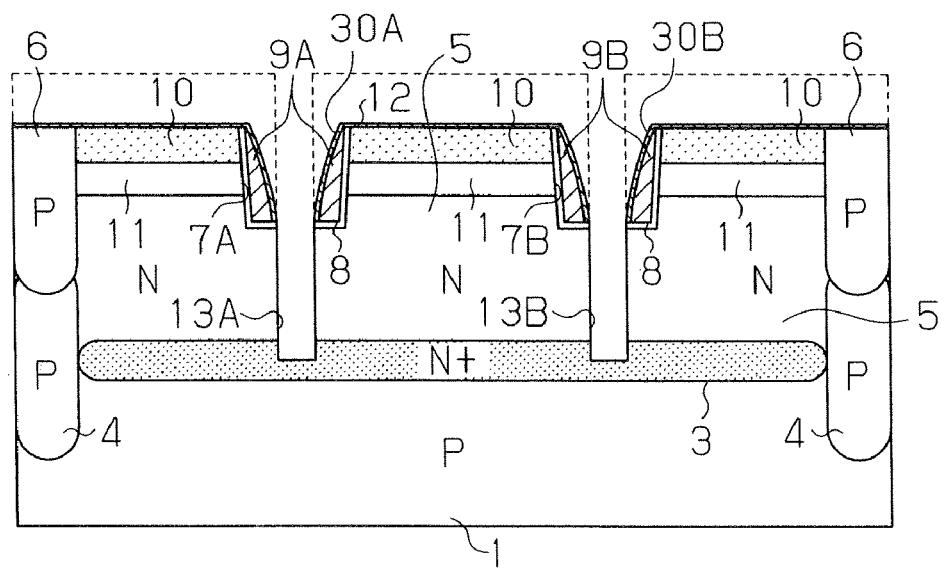
FIG. 9 is a schematic cross-sectional view showing the process for manufacturing the semiconductor device of FIG. 1A.

[7] The gate insulation film 8 is removed, and then a resist pattern closing the openings of the trench grooves 7A and 7B is formed as indicated by the broken lines in FIG. 8. Arsenic (As) is ion-implanted into the upper surface of the epitaxial silicon layer 5, and then boron is ion-implanted at a position deeper than the position arsenic is implanted. The arsenic and boron are activated by a heat treatment. This forms a source diffusion layer 10 and a body diffusion layer 11 on the epitaxial silicon layer 5.

[8] An insulation film 12 is formed to cover an upper surface of the source diffusion layer 10, upper surfaces of the gate electrodes 9A and 9B, and upper surfaces of the gate insulation films 8, which are formed on the bottom of the trench grooves 7A and 7B. As indicated by the broken lines in FIG. 9, a resist pattern is formed so as to expose the area of the bottom of the trench groove 7A free from the gate electrode 9A and the area of the bottom of the trench groove 7B free from the gate electrode 9B. Etching is performed using the resist pattern as a mask to form grooves 13A and 13B that extend from the bottom of the trench grooves 7A and 7B to the buried diffusion layer 3. As a result, the trench groove 7A (specifically, the portion of the trench groove 7A inward from the gate electrode 9A) and the groove 13A form a trench groove 30A, and the trench groove 7B (specifically, the portion of the trench groove 7B inward from the gate electrode 9B) and the groove 13B form a trench groove 30B.

Figure 10:
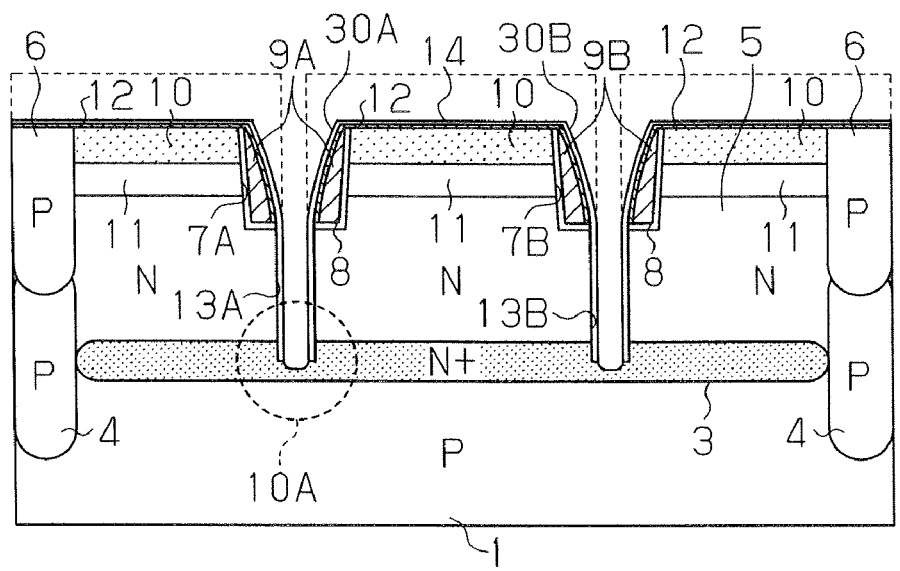
FIG. 10 is a schematic cross-sectional view showing the process for manufacturing the semiconductor device of FIG. 1A.

[9] As shown in FIG. 10, an insulation film 14 is formed to cover an upper surface of the insulation film 12 and the inner wall and bottom of the trench grooves 30A and 30B. The insulation film 14 is etched back to remove portions of the insulation film 14 deposited on the bottom of the trench grooves 30A and 30B.

Figure 10A:
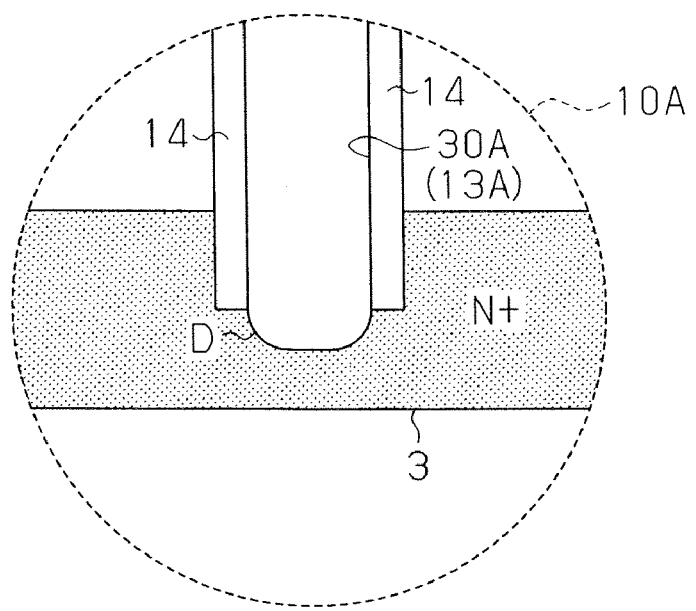
FIG. 10A is an enlarged view showing the encircled region 10A of FIG. 10.

FIG. 10A is a schematic enlarged view of region 10A, which is encircled by a broken line in FIG. 10. The insulation film 14 is etched back for a time longer than the time required to remove portions of the insulation film 14 from the bottom of the trench grooves 30A and 30B. This removes a portion of the buried diffusion layer 3 under the insulation film 14 to form a recessed groove D as shown in FIG. 10A. The groove D increases the area of contact between the buried diffusion layer 3 and drain lead electrodes 15A and 15B that are formed in the trench grooves 30A and 30B in processes that will be described later. More specifically, the drain lead electrode 15A formed in the trench groove 30A comes in contact with the buried diffusion layer 3 not only at the bottom surface of the groove D but also at two side surfaces of the groove D as shown in FIG. 10A. This reduces the resistance generated by contact of the drain lead electrodes 15A and 15B with the buried diffusion layer 3 and consequently reduces drain resistance.

Figure 11:
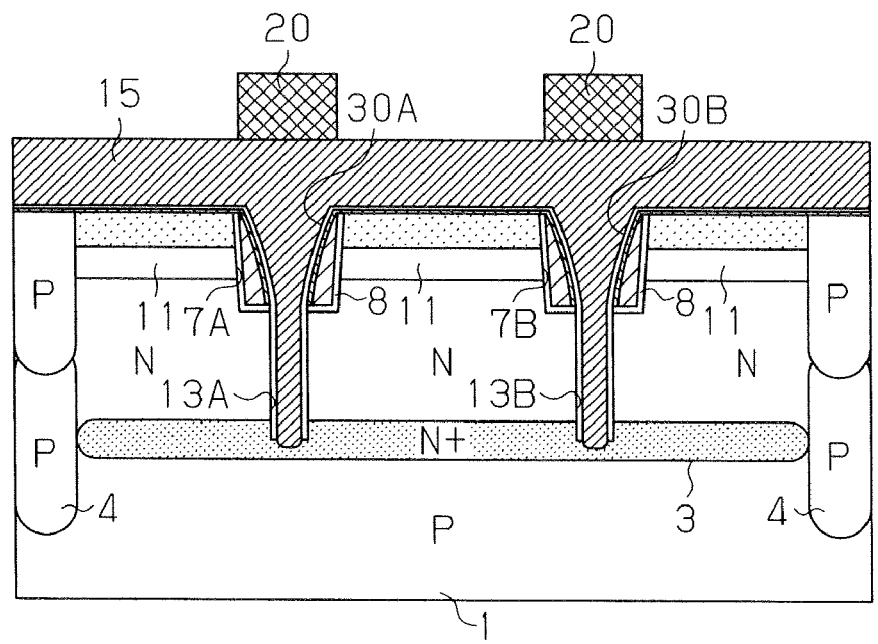
FIG. 11 is a schematic cross-sectional view showing the process for manufacturing the semiconductor device of FIG. 1A.
Figure 12:
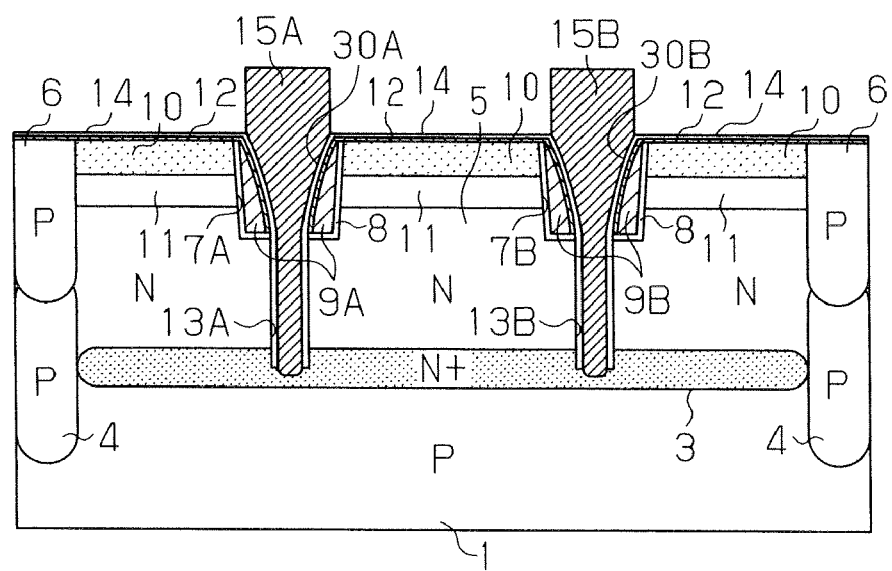
FIG. 12 is a schematic cross-sectional view showing the process for manufacturing the semiconductor device of FIG. 1A.

[10] As shown in FIG. 11, tungsten (W) 15 is deposited in the trench grooves 30A and 30B. A resist pattern 20 is formed on the tungsten 15. The tungsten 15 is then etched through the resist pattern 20. This forms the drain lead electrodes 15A and 15B in the trench grooves 30A and 30B (refer to FIG. 12).

The film thickness of the deposited tungsten must be at least one half the width of the grooves 13A and 13B. This reduces pores produced in the tungsten. Further, the drain lead electrodes 15A and 15B are formed in a manner that their upper end portions are located at positions higher than the surface of the semiconductor substrate or the surface of the source diffusion layer 10. The height of the upper end portions of the drain lead electrodes 15A and 15B is determined by the film thickness of the tungsten.

Figure 13:
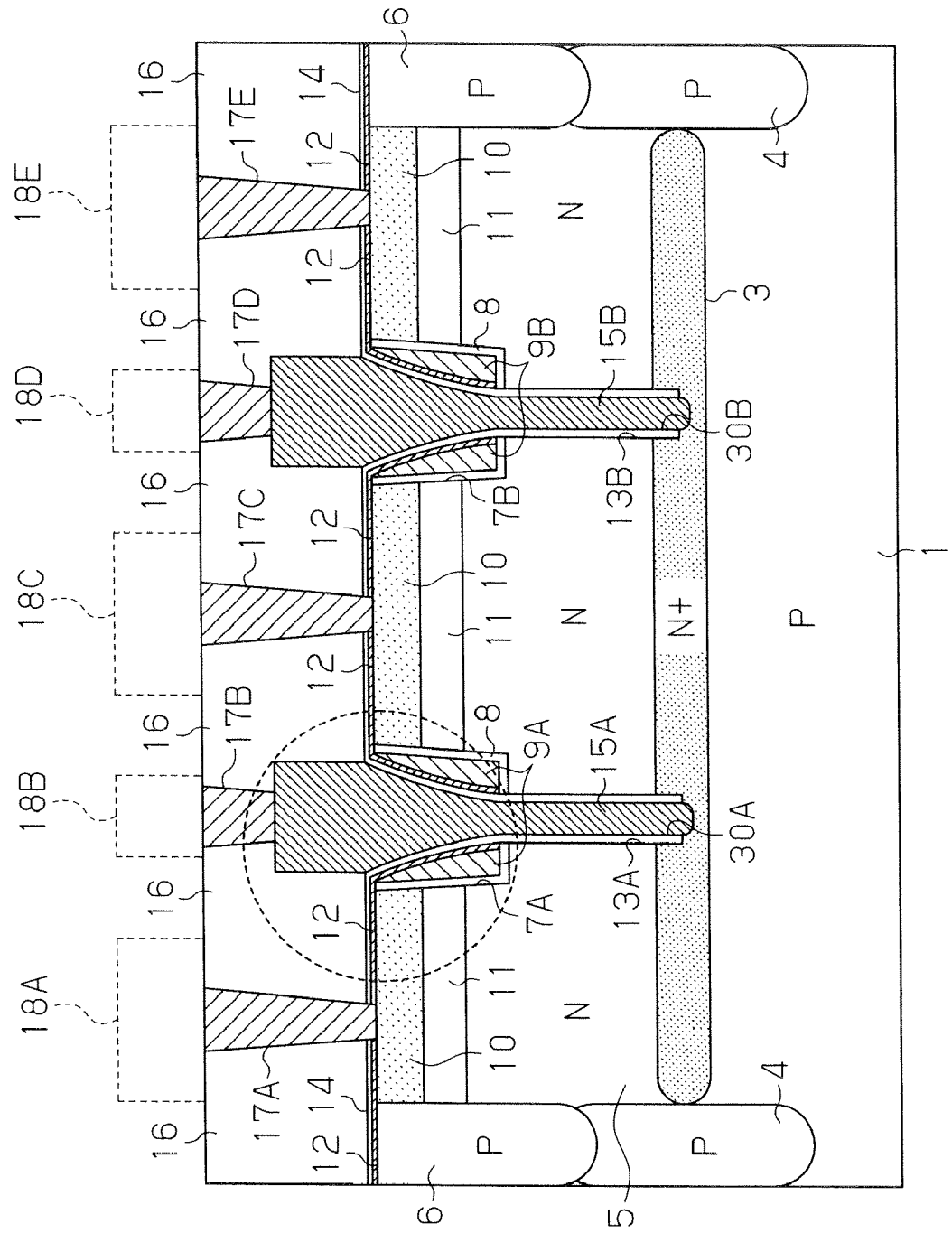
FIG. 13 is a schematic cross-sectional view showing the process for manufacturing the semiconductor device of FIG. 1A.

[11] As shown in FIG. 13, an interlayer insulation film 16 is formed on the epitaxial silicon layer 5. Contact holes are formed in the interlayer insulation film 16 in a manner that the contact holes extend to the source diffusion layer 10 or the drain lead electrodes 15A and 15B. Tungsten is then deposited in the contact holes by performing chemical vapor deposition (CVD) and then etched back to form contact plugs 17A to 17E in the contact holes. As indicated by the broken lines in FIG. 13, metal wires 18A to 18E, which are electrically connected to the contact plugs 17A to 17E, are formed. This completes the essential structure of the semiconductor device in the first embodiment.

In the first embodiment, each of the drain lead electrodes 15A and 15B corresponds to a conductor, the source diffusion layer 10 corresponds to a conductive layer, and the buried diffusion layer 3 corresponds to a wiring layer. Further, the silicon substrate 1 and the epitaxial silicon layer 5 (including the source diffusion layer 10 and the body diffusion layer 11) form a semiconductor substrate. The trench groove 7A and the groove 13A or the trench groove 7B and the groove 13B are combined to form a trench groove of the present invention.

The features of the drain lead electrodes 15A and 15B formed through the manufacturing processes of the first embodiment will now be described.

FIG. 13A is a schematic enlarged view showing the region encircled by a broken line in FIG. 13. The drain lead electrode 15A will be described as an example with reference to FIG. 13A. The other drain lead electrodes such as the drain lead electrodes 15B have identical structures.

A first characteristic of the drain lead electrode 15A is in that an edge 71 of an upper end portion of the drain lead electrode 15A is located above the surface of the source diffusion layer 10, preferably, higher than the surface of the insulation film 14, as shown in FIG. 13A. With the recent trend toward higher withstand voltages of semiconductor elements, high voltage is applied to the drain lead electrode 15A. Thus, an electric field may concentrate at the upper end portion of the drain lead electrode 15A, particularly, at the edge of the upper end portion when the edge does have an obtuse angle. A state in which the upper end portion of the drain lead electrode 15A is located at a height equal to or lower than the surface of the insulation film 14 as indicated by the dashed line 70 will now be discussed. In this case, the upper end portion of the drain lead electrode 15A would have an edge 72 located at the same level as the dashed line 70. In this case, the distance between the edge 72 and the gate electrode 9A would not be more than the film thickness of the insulation films 12 and 14. Thus, electric field concentration at the edge 72 may inflict insulative damages to the insulation films 12 and 14 and the gate insulation film 8. In particular, the manufacturing processes of the first embodiment form the side surface of the drain lead electrode 15A that is inward from the gate electrode 9A as a tapered surface. Thus, the edge 72 would have an acute angle of θe between the upper end portion and side surface of the drain lead electrode 15A. This would enhance the electric field concentration at the edge 72, and insulative damages may be more easily inflicted to the insulation films 12 and 14 and the gate insulation film 8. To prevent such insulative damages, the drain lead electrode 15A is formed to be higher than the surface of the insulation film 14. This sufficiently increases the distance between the edge 71 of the drain lead electrode 15A and the gate electrode 9A, that is, the distance between the edge 71 and the semiconductor substrate. Even when electric field is concentrated at the edge 71, insulative damages caused by partial discharging from the edge 71 is prevented.

A second feature of the drain lead electrode 15A is that a side surface of the drain lead electrode 15A includes a first plane and a second plane that are adjacent to each other. The side surface further includes inflection points determining the angle of the second plane with respect to the first plane (a boundary point between the first plane and the second plane). The inflection points are located at a level that is lower than or flush to the level of the dashed line 70. The angle of the first plane relative to the second plane at an inflection point is always an obtuse angle. In the present specification, the "first plane" refers to a plane having a substantially linear cross-section that is parallel to the heightwise direction of the semiconductor substrate. In FIG. 13A, for example, the side surface of the drain lead electrode 15A includes a first plane P1 in the groove 13A and a further first plane P2 extending upward from the insulation film 14. The "second plane" refers to a plane inclined at a predetermined angle with respect to the first plane. The second plane may be an inclined plane having a substantially linear cross-section, or an inclined plane having a substantially curved cross-section. In FIG. 13A for example, the side surface of the drain lead electrode 15A includes a second plane T1 arranged between the first planes P1 and P2. In this case, the side surface of the drain lead electrode 15A includes a first inflection point I1 determining angle θ1 of the second plane T1 with respect to the first plane P1 and a second inflection point I2 determining an angle θ2 of the second plane T1 with respect to the first plane P2. The angle θ1 is an obtuse angle (θ1>90°), and the angle θ2 is also an obtuse angle (θ2>90°). Since the angles θ1 and θ2 are not obtuse angles, concentration of an electric field at the inflection points is suppressed. Even when an inflection point is located along on the dashed line 70 or below the line 70, the insulation films 12 and 14 and the gate insulation film 8 are prevented from being damaged by electric field concentration.

The semiconductor device of the first embodiment has the advantages described below.

(1) The drain lead electrodes 15A and 15B are formed so that their upper end portions are located above the surface of the insulation film 14. This ensures sufficient distance between the edges 71 of the drain lead electrodes 15A and 15B and the semiconductor substrate and suppresses partial discharging from the edges 71 to the semiconductor substrate. Thus, the thin insulation films (the interlayer insulation films 12 and 14) arranged between the semiconductor substrate and the drain lead electrodes are prevented from being damaged, and the reliability of the semiconductor device is improved.

(2) The side surfaces of the drain lead electrodes 15A and 15B that come in contact with the insulation film 14 inward from the trench grooves 30A and 30B have at least one inflection point. The angle formed by the first plane and the second plane at the inflection point is an obtuse angle. This suppresses the concentration of electric field at each inflection point of the drain lead electrode 15A that comes in contact with the insulation film 14. As a result, fusion and insulative damages caused by electric field concentration at the drain lead electrodes 15A and 15B are prevented.

(3) The recessed grooves D are formed in the buried diffusion layer 3 under the trench grooves 30A and 30B. This increases the area of contact of the drain lead electrodes 15A and 15B with the buried diffusion layer 3 and reduces the drain resistance.

(4) The cross-sectional area of the upper end portion of the drain lead electrode 15A in the horizontal direction is greater than the cross-sectional area of the lower end of the contact plug 17B in the horizontal direction. If the film thickness of the interlayer insulation film 16 were to be uniform, the drain lead electrode 15A protruding from the semiconductor substrate surface would shorten the contact plug 17B in the vertical direction. As a result, the drain lead electrode 15A having a large cross-sectional area or low resistance occupies a greater area in the interlayer insulation film 16, and the contact plug 17B having a small cross-sectional area or high resistance occupies a smaller area in the interlayer insulation film 16. This lowers the resistance between each drain lead electrode and each contact plug and consequently reduces power consumption of the semiconductor device.

(5) The contact plugs 17A, 17C, and 17E between the source diffusion layer 10 and the metal wires 18A, 18C, and 18E and the contact plugs 17B and 17D between the drain lead electrodes 15A and 15B and the metal wires 18B and 18D are made of metal. This further reduces the wiring resistance of the semiconductor substrate and also reduces variations in the current distribution between the DMOSFETs.

A semiconductor device according to a second embodiment of the present invention will now be described. The semiconductor device of the second embodiment basically has the same structure as the semiconductor device of the first embodiment.

Figure 14:
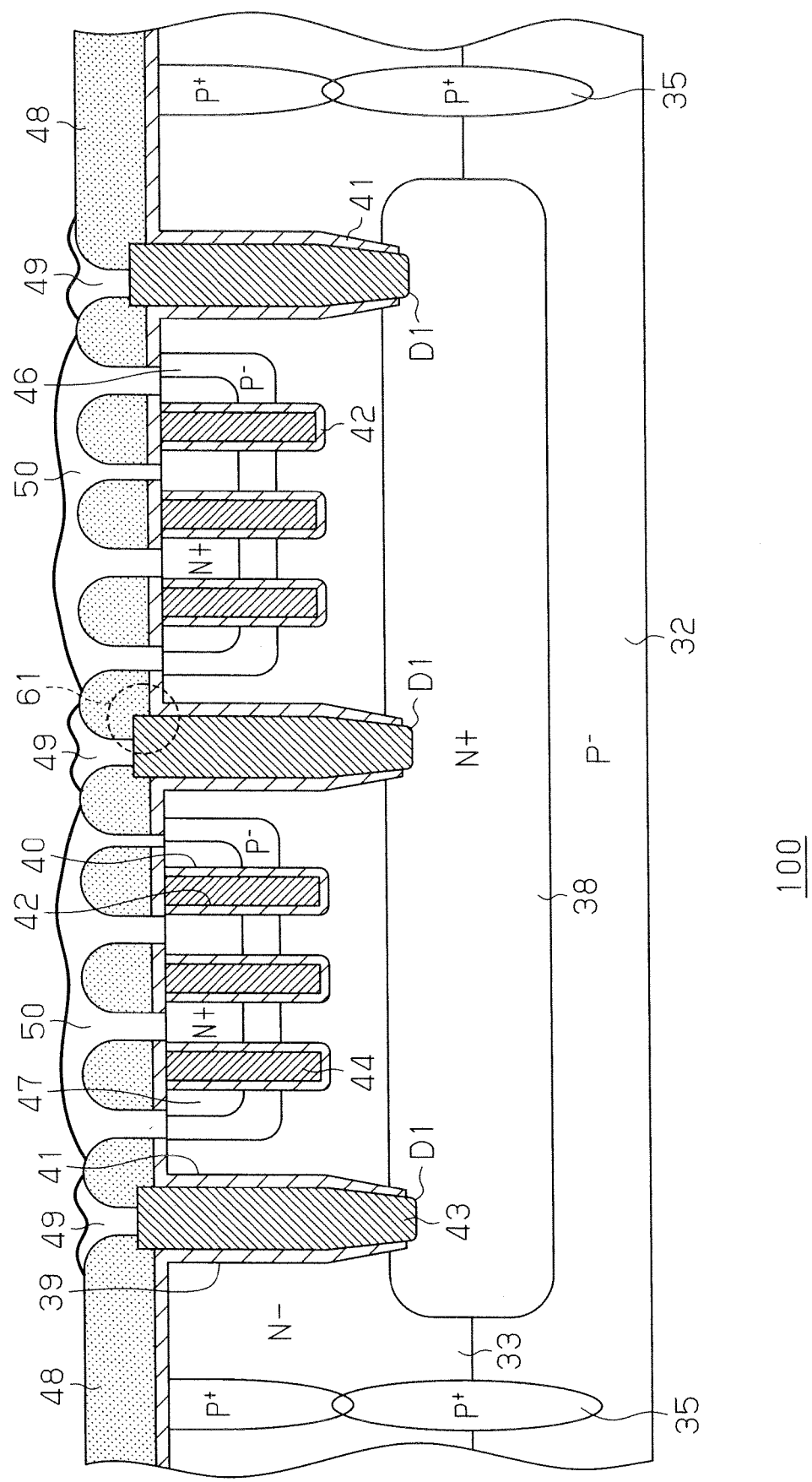
FIG. 14 is a cross-sectional view showing part of a semiconductor device according to a second embodiment of the present invention.

FIG. 14 is a cross-sectional view of a vertical N-channel MOS transistor 100.

An n-type silicon epitaxial layer 33 is formed on a p-type monocrystalline silicon substrate 32. A p-type isolation diffusion layer 35 extends through the substrate 32 and the epitaxial layer 33 so as to form an island region. Although FIG. 14 shows only one island region in the second embodiment, a plurality of island regions are actually formed. A vertical transistor, such as an N-channel MOS transistor, a P-channel MOS transistor, or an NPN transistor, may be formed in each island region.

An n-type buried layer 38 is formed between the substrate 32 and the epitaxial layer 33 with the interface of the substrate 32 and the epitaxial layer 33 located therein. The buried layer 38 is formed within the range of a semiconductor element formation region that is formed above the buried layer 38. Inner side walls of a first trench 39 are covered by a silicon oxide film 41 for insulating the drain and the substrate. A portion of the silicon oxide film 41 is removed from the bottom of the first trench 39. The buried layer 38 includes a recessed groove D1 located under the bottom of the first trench 39. A drain lead electrode 43 is filled in the first trench 39 and in the groove D1. The drain lead electrode 43 is electrically connected to the buried layer 38. The drain lead electrode 43 protrudes from the epitaxial layer 33, and is formed to be higher than the silicon oxide film 41 covering the surface of the epitaxial layer 33.

In the second embodiment, a portion of the epitaxial layer 33 on the first buried layer 38 is used as a formation region for gate electrodes 44 and a source region 47. More specifically, the epitaxial layer 33 includes a p-type diffusion region functioning as a channel region 46 and an n-type diffusion region functioning as the source region 47 that are formed through dual diffusion. The epitaxial layer 33 includes a plurality of second trenches 40 in which the gate electrodes 44 are formed. The second trenches 40 are formed at equal intervals. The second trenches 40 are formed to be deep enough to extend through the channel region 46 and the source region 47 but not deep enough to reach the buried layer 38. A silicon oxide film 42 is formed to cover inner surfaces of the second trenches 40. Polysilicon is filled in the second trenches 40. An n-type impurity, such as phosphorous, is included in the polysilicon. In the second embodiment, polysilicon is used to form the gate electrodes 44, and the silicon oxide film 42 is used to form a gate dielectric film.

An insulation film 48 is formed on the epitaxial layer 33. Contact holes are formed in the insulation film 48. Metal layers that function as drain electrodes 49 and source electrodes 50 are buried in the contact holes. The source electrodes 50 are formed on the source region 47. The gate electrodes 44 in the second trenches 40 are insulated from the source electrodes 50 by the silicon oxide film 41 and the insulation layer 48. The drain lead electrodes 43 in the first trenches 39 are connected to the drain electrodes 49. In the MOS transistor 100 of the second embodiment, the epitaxial layer 33 is used to form a drain region and the channel region 46 is used to form a channel formation region.

In the MOS transistor 100 with the above-described structure, voltage is applied to the drain electrodes 49 and the source electrodes 50 in a manner that the drain electrodes 49 have a higher potential than the source electrodes 50. A predetermined voltage is applied to the gate electrodes 44. As a result, current flows from the drain electrodes 49 to the source electrodes 50.

A process for manufacturing the vertical N-channel MOS transistor 100 of the second embodiment will now be described with reference to FIGS. 16 to 21.

Figure 16:
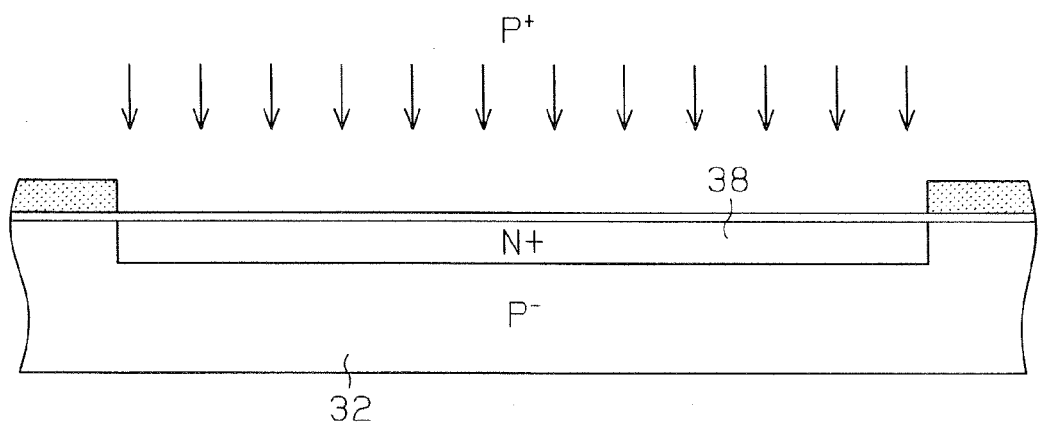
FIG. 16 is a schematic cross-sectional view showing a process for manufacturing the semiconductor device of FIG. 14.

[1] As shown in FIG. 16, the surface of a p-type monocrystalline silicon substrate 32 is thermally oxidized to form a silicon oxidation film on the entire substrate surface. A resist mask having an opening corresponding to an area in which a first buried layer 38 is formed is applied to the silicon substrate 32. N-type impurity, such as phosphorous, is then ion-implanted into the surface of the substrate 32 using the mask and then diffused.

Figure 17:
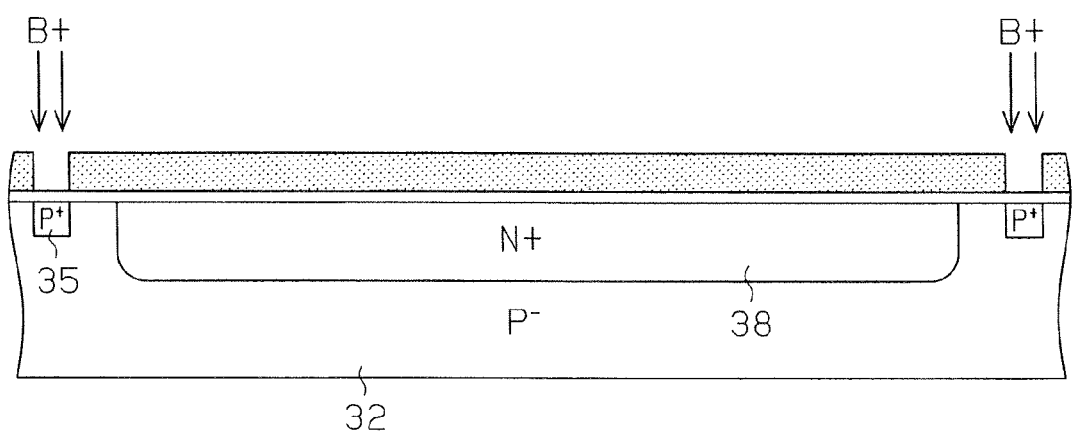
FIG. 17 is a schematic cross-sectional view showing the process for manufacturing the semiconductor device of FIG. 14.

[2] As shown in FIG. 17, a resist mask having an opening corresponding to an area in which an isolation diffusion layer 35 is formed is applied to the silicon oxidation film. A p-type impurity, such as boron, is implanted into the surface of the substrate 32 using the mask. This simultaneously diffuses the buried layer 38.

Figure 18:
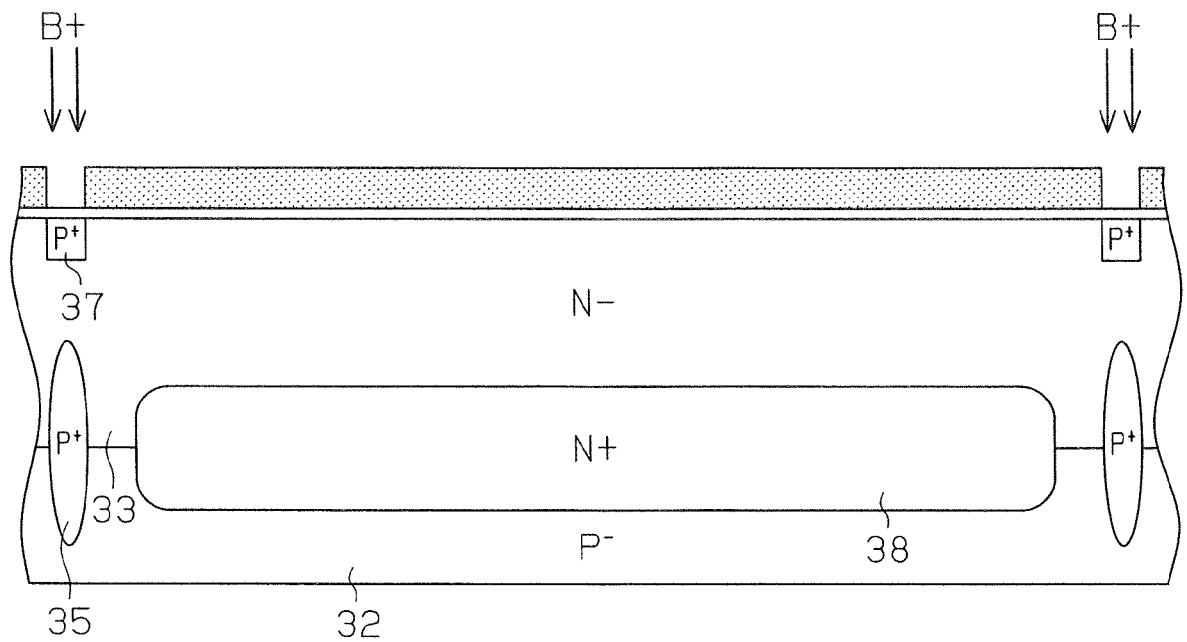
FIG. 18 is a schematic cross-sectional view showing the process for manufacturing the semiconductor device of FIG. 14.

[3] As shown in FIG. 18, the silicon oxidation film is entirely removed, and an epitaxial layer 33 is grown on the substrate 32. The p-type impurity that has been implanted is diffused to form an isolation diffusion layer 35. The surface of the epitaxial layer 33 is then thermally oxidized to form a silicon oxidation film. A resist mask having an opening corresponding to the area in which the isolation diffusion layer 35 has been formed is applied to the epitaxial layer 33. A p-type impurity, such as boron, is ion-implanted into the surface of the substrate 32 using the mask and then diffused. This forms the two layers of isolation diffusion layers 35 and 37.

Figure 19:
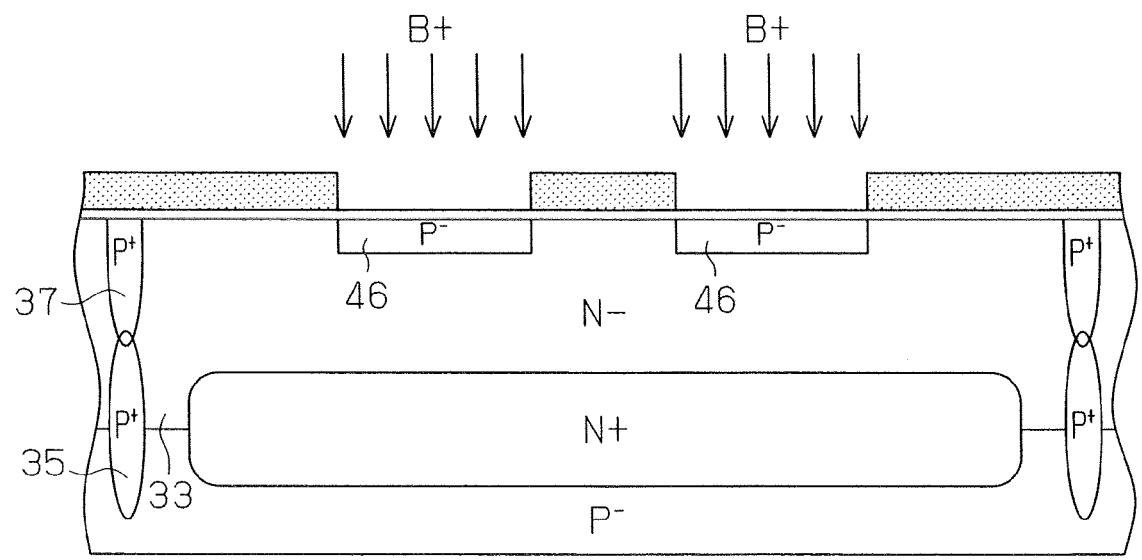
FIG. 19 is a schematic cross-sectional view showing the process for manufacturing the semiconductor device of FIG. 14.

[4] As shown in FIG. 19, a resist mask having an opening corresponding to the area in which a channel region 46 is formed is applied to the silicon oxidation film. A p-type impurity, such as boron, is ion-implanted into the surface of the substrate 32 using the mask and then diffused. This forms the channel region 46.

Figure 20:
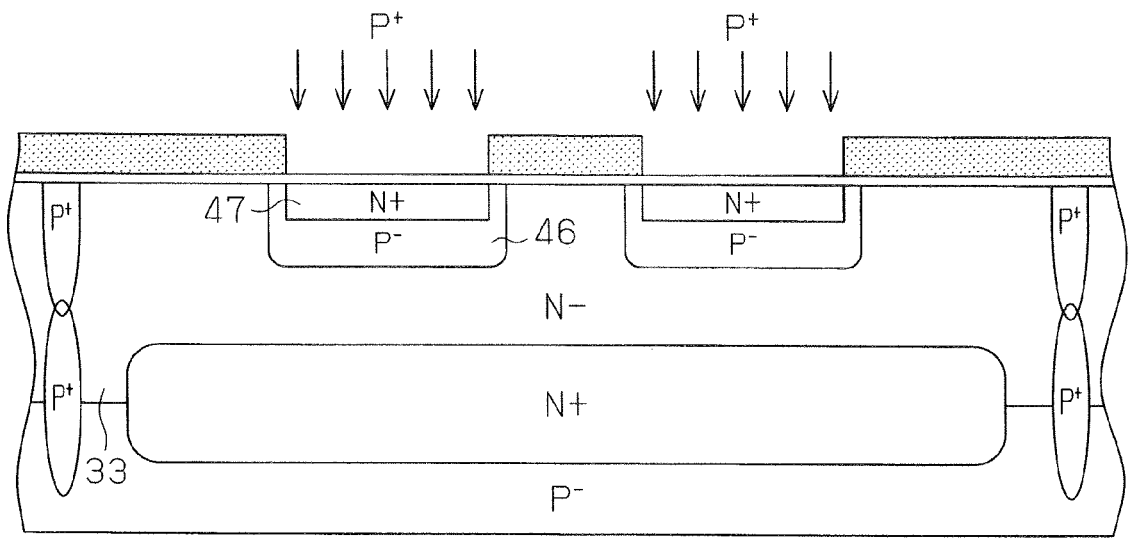
FIG. 20 is a schematic cross-sectional view showing the process for manufacturing the semiconductor device of FIG. 14.

[5] As shown in FIG. 20, a resist mask having an opening corresponding to the area in which a source region 47 is formed is applied to the silicon oxidation film. An n-type impurity, such as phosphorous, is ion-implanted into the surface of the substrate 32 using the mask and then diffused. This forms the source region 47.

Figure 21:
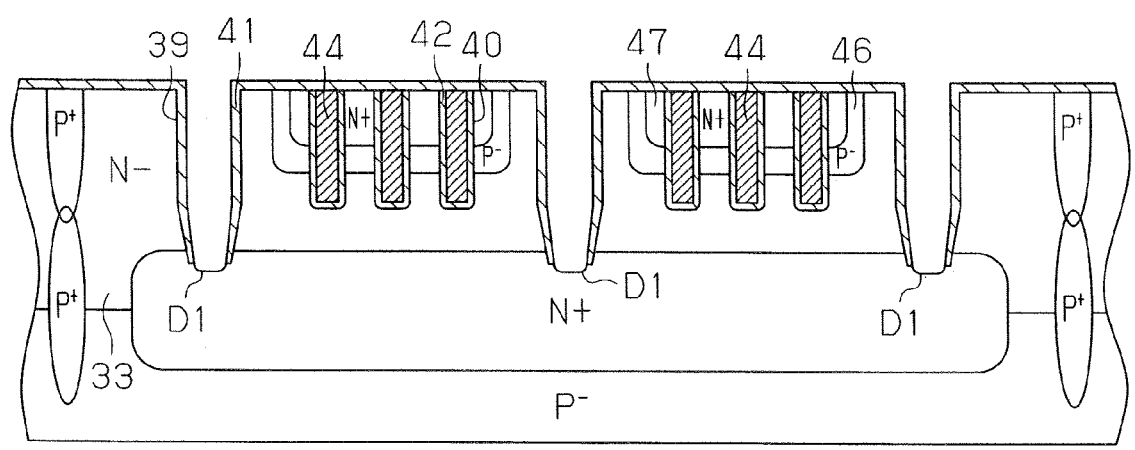
FIG. 21 is a schematic cross-sectional view showing the process for manufacturing the semiconductor device of FIG. 14.

[6] After removing the silicon oxidation film and the resist mask, a silicon nitride film (not shown) is deposited on the entire surface of the epitaxial layer 33. Portions of the silicon nitride film are selectively removed by performing photolithography to form openings corresponding to areas in which second trenches 40 are formed. As shown in FIG. 21, the second trenches 40 that extend through the channel region 46 and the source region 47 are formed at uniform intervals in the source region 47. The surface of the epitaxial layer 33 is thermally oxidized to form a silicon oxidation film 42 in each second trench 40. Polysilicon is then deposited at positions inward from the silicon oxidation film 42 in each second trench 40. An n-type impurity is included in the polysilicon to form the gate electrodes 44. The silicon oxidation film 42 may be formed so that it has a different film thickness on the surface of the epitaxial layer 33 and within the second trenches 40.

Next, first trenches 39 are formed to reach the buried layer 38. An insulation film 41 is formed to cover an upper surface of the epitaxial layer 33 and inner walls and bottoms of the first trenches 39. Portions of the insulation film 41 formed on the bottoms of the trenches 39 are removed. The time for which the insulation film 41 is etched back is adjusted to remove portions of the buried layer 38 under the first trenches 39. This forms recessed grooves D1.

[7] Referring to FIG. 14, for example, tungsten is deposited in the trenches 39, and drain lead electrodes 43 are formed by performing photolithography and etching.

The film thickness by which the tungsten is deposited must be at least one half the width of the trenches 39. This reduces pores produced in the tungsten. Tungsten is deposited in the trenches 39 as well as on the upper surface of the epitaxial layer 33. Afterwards, tungsten is etched using a selection mask (not shown). This forms the drain lead electrodes 43. Although not shown in the drawings, a thin film of, for example, TiN may be formed between the drain lead electrodes 43 and the buried layer 38. The TiN film improves the degree of contact between the drain lead electrodes 43 and the insulation film 41 and also prevents the surface of the buried layer 38 from being eroded by gas or the like used when tungsten is deposited. As a result, the drain lead electrodes 43 connected to the buried layer 38 are formed inside the trenches 39. The drain lead electrodes 43 are formed to be higher than the surface of the insulation film 41. The height of the drain lead electrodes 43 is determined by the film thickness by which the tungsten is deposited.

Next, an insulation layer 48 is deposited on the epitaxial layer 33. As a result, the gate electrodes 44 formed in the second trenches 40 are entirely covered by the silicon oxidation film 42 and the insulation layer 48 and completely insulated from the source electrodes 50. Afterwards, contact holes for formation of external electrodes are formed by performing photolithography. This completes the vertical N-channel MOS transistor 100 shown in FIG. 14.

In the second embodiment, the drain lead electrode 43 corresponds to a conductor, the source region 47 corresponds to a conductive layer, and the buried layer 38 corresponds to a wiring layer. Further, the silicon substrate 32 and the epitaxial layer 33 correspond to a semiconductor substrate. The first trench 39 corresponds to a trench groove.

The semiconductor device of the second embodiment has the advantages described below.

Figure 15:
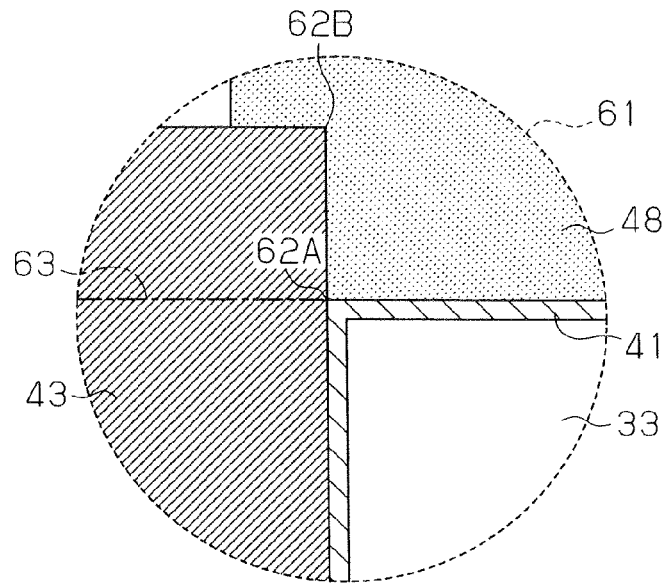
FIG. 15 is an enlarged view showing the encircled region 61 of FIG. 14.

(1) The drain lead electrodes 43 are formed in a manner that their upper end portions are located above the surface of the insulation film 41. FIG. 15 is an enlarged view showing region 61 encircled by a broken line in FIG. 14. As shown in FIG. 15, the upper end portion of the drain lead electrode 43 is located above the insulation film 41 covering the surface of the epitaxial layer 33. When assuming that the upper end portion of the drain lead electrode 43 is located at a position equal to or lower than the level an dashed line 63, which indicates the height of the surface of the insulation film 41, the upper end portion of the drain lead electrode 43 would have an edge 62A located at the height indicated by the dashed line 63. In this case, the distance between the epitaxial layer 33 and the edge 62A would be less than the film thickness of the insulation film 41. High voltage is applied to the drain lead electrode 43. Thus, electric field concentrates on the edge 62A which does not have an obtuse angle. This may easily inflict insulative damages to the insulation film 41 to have. To prevent such insulative damages, the upper end portion of the drain lead electrode 43 is formed to be higher than the surface of the insulation film 41 in the second embodiment. This results in the distance between the edge 62B and the epitaxial layer 33 being greater than or equal to the film thickness of the insulation film 41 and suppresses insulative damages inflicted to the insulation film 41 by partial discharging from the edge 62B.

(2) The recessed grooves D1 are formed in portions of the buried layer 38 under the first trenches 39. This increases the area of contact between the drain lead electrodes 43 and the buried layer 38 and reduces drain resistance.

(3) The cross-sectional area of the upper end portion of the drain lead electrode 43 in the horizontal direction is greater than the cross-sectional area of the lower end portion of the drain electrode 49 in the horizontal direction. When the film thickness of the interlayer insulation film 48 is uniform, the drain lead electrode 43 protruding from the semiconductor substrate surface shortens the drain electrode 49 in the vertical direction. In such a case, the drain lead electrode 43 having a large cross-sectional area, that is, a small resistance, occupies a greater area in the interlayer insulation film 48, and the drain electrode 49 having a small cross-section, that is, a high resistance, occupies a smaller area in the interlayer insulation film 48. This lowers the resistance between each drain lead electrode 43 and each drain electrode 49, and consequently reduces the power consumption of the semiconductor device.

(4) The drain lead electrode 43 of the MOS transistor 100 is formed in each island region of the epitaxial layer 33. The drain electrode 49 connected to the drain lead electrode 43 is formed on the element surface. In this case, the drain electrodes 49 may be connected to any wire, and different drain voltages may be applied to the drain electrodes 49 depending on the application of the semiconductor device. This enables the control of various operations with a single chip and realizes multiple functions.

(5) The drain lead electrodes 43 may be formed in the first trenches 39 using highly concentrated n-type polysilicon instead of tungsten. In this case, the silicon oxide film 41 formed on the side walls of the first trenches 39 insulates the drain lead electrodes 43 and the semiconductor substrate and suppresses the diffusion of impurities from the drain lead electrodes 43 toward the semiconductor substrate.

It should be apparent to those skilled in the art that the present invention may be embodied in many other specific forms without departing from the spirit or scope of the invention. Particularly, it should be understood that the present invention may be embodied in the following forms.

Figure 22:
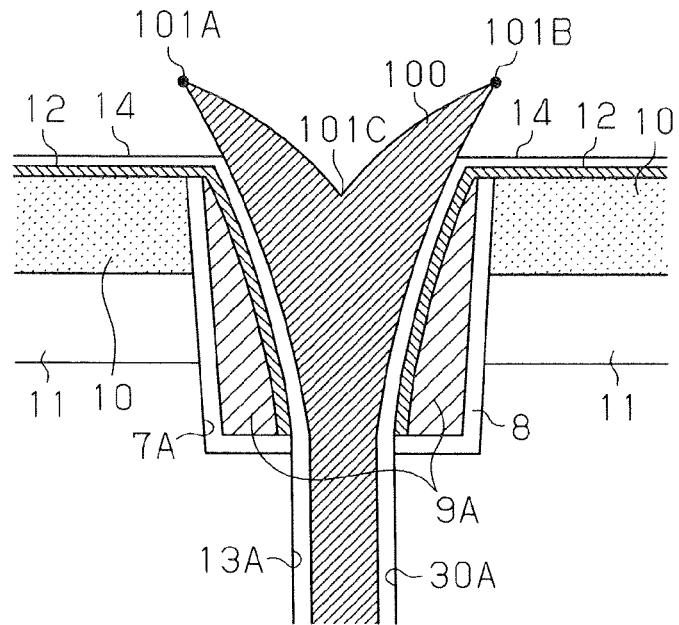
FIG. 22 is a schematic cross-sectional view showing a further drain lead electrode.

(a) The cross-sectional shape of the conductor in the present invention is not limited to the truncated conical shape of the first embodiment or the circular cylindrical shape of the second embodiment. For example, the conductor may have the structure shown in FIG. 22. A drain lead electrode 100 is formed in a trench groove 30A at a position inward from an insulation film 14 in the same manner as in the first embodiment. An upper surface of the drain lead electrode 100 has two edges 101A and 101B protruding from an upper surface of the insulation film 14 and a recess 101C formed between the edges 101A and 101B. The recess 101C may be formed to be lower than the upper surface of the insulation film 14 or to be even lower than an upper surface of a source diffusion layer 10. More specifically, the drain lead electrode 100 is formed in a manner that portions of its upper surface (the edges 101A and 101B) are higher than the upper surface of the insulation film 14. In this structure, the distance from the edges 101A and 101B to a gate electrode 9A is greater than or equal to the film thickness of insulation films 12 and 14. The drain lead electrode 100 shown in FIG. 22 has the same advantages as described in the first embodiment.

Figure 23:
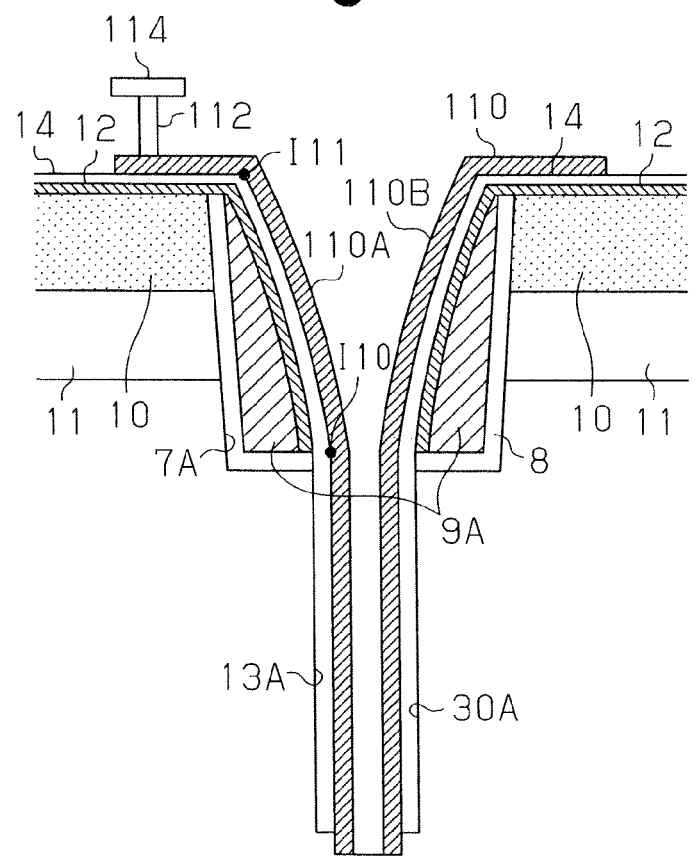
FIG. 23 is a schematic cross-sectional view showing a further drain lead electrode.

(b) The conductor of the present invention may have the structure shown in FIG. 23. A drain lead electrode 110 includes two electrode portions 110A and 110B arranged inward from an insulation film 14. More specifically, the drain lead electrode 110 has a hollow structure so as to have a V-shaped cross-section as shown in FIG. 23. The drain lead electrode 110 has an open upper end portion. The upper end portions of the electrode portions 110A and 110B are formed to cover the surface of an insulation film 14 and are connected to a wire 114 via a contact 112. In this structure, the electrode portions 110A and 110B include two inflection points I10 and I11. The angle between a first plane and a second plane at the first inflection point I10 is an obtuse angle. Further, an angle between a first plane and a second plane at the second inflection point I11 is also an obtuse angle. The drain lead electrode 110 shown in FIG. 23 has the same advantages as described in the first embodiment. Further, this structure improves the freedom of arrangement for the wire 114 connected to the drain lead electrode 110. Although the electrode portions 110A and 110B are shown to be separated from one each other in FIG. 22, the electrode portions 110A and 110B may be connected to each other at the bottom of the trench. This would increase the area of contact of the electrode portions 110A and 110B with the wiring layer.

(c) The conductor of the present invention may have the structures shown in FIG. 24A to 24D. Drain lead electrodes 200, 210, 220, and 230 shown in FIGS. 24A to 24D are each formed in a first trench 39 in the same manner as in the second embodiment.

Figure 24A:
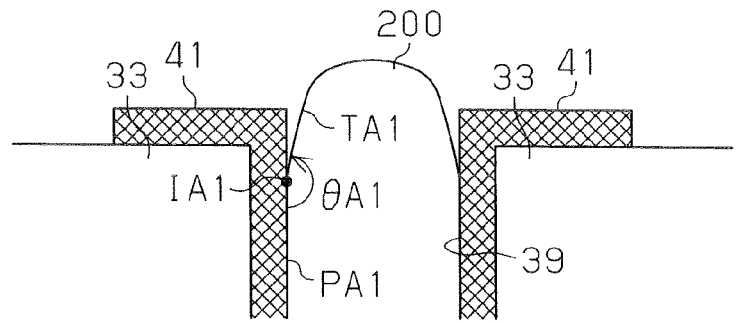
FIG. 24A is a schematic cross-sectional view showing a further drain lead electrode.

(c1) The drain lead electrode 200 shown in FIG. 24A includes a first plane PA1 and a second plane TA1 and has an inflection point IA1 at a position lower than the surface of a semiconductor substrate (or an epitaxial layer 33). The angle $\theta A1$ of the first plane PA1 and the second plane TA1 at the inflection point IA1 is an obtuse angle. Thus, this structure also has the same advantages as described in the second embodiment.

Figure 24B:
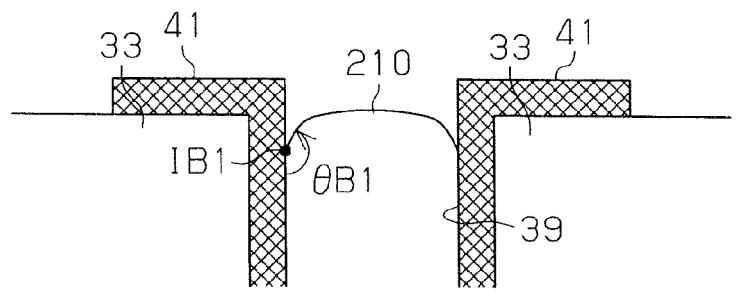
FIG. 24B is a schematic cross-sectional view showing a further drain lead electrode.

(c2) The drain lead electrode 210 shown in FIG. 24B may be so that its upper end portion is located at the same height as the surface of an epitaxial layer 33 or slightly lower than the height of the surface of the epitaxial layer 33. The drain lead electrode 210 has an inflection point IB1 located at a position lower than the surface of the epitaxial layer 33. Angle $\theta B1$ at the inflection point IB1 is an obtuse angle. This structure also has the same advantages as described in the second embodiment.

Figure 24C:
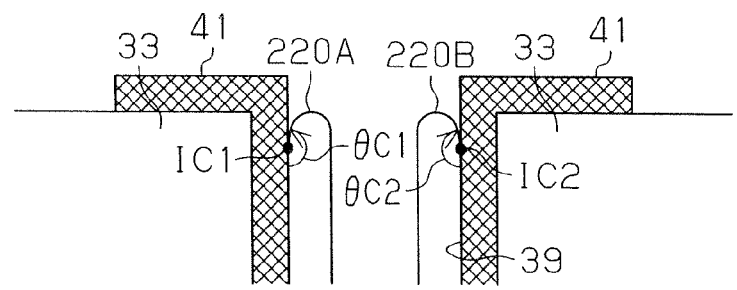
FIG. 24C is a schematic cross-sectional view showing a further drain lead electrode.

(c3) The drain lead electrode 220 shown in FIG. 24C has a hollow cross-sectional structure. An upper end portion of the drain lead electrode 220 has an opening in its middle portion. The drain lead electrode 220 includes electrode portions 220A and 220B. The electrode portion 220A has an inflection point IC1. The electrode portion 220B has an inflection point IC2. An angle $\theta C1$ at the first inflection point IC1 and an angle $\theta C2$ at the second inflection point IC2 are both obtuse angles. This structure also has the same advantages as described in the second embodiment.

Figure 24D:
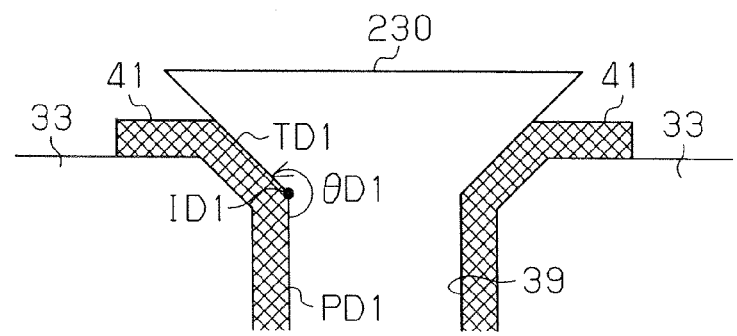
FIG. 24D is a schematic cross-sectional view showing a further drain lead electrode.

(c4) The drain lead electrode 230 shown in FIG. 24D is formed so that its upper end portion is higher than the surface of an insulation film 41. A side surface of the drain lead electrode 230 includes a second plane TD1 formed on its upper portion. The drain lead electrode 230 is formed in a manner that its upper end portion has a greater width than its portion inside a trench 39. The drain lead electrode 230 has an inflection point ID1 at a position lower than the surface of an epitaxial layer 33. An angle $\theta D1$ formed by a second plane TD1 and a first plane PD1 at the inflection point ID1 is an obtuse angle. This structure also has the same advantages as described in the first and second embodiments.

(d) Although the conductor of the present invention is made of tungsten having a low electric resistance, the conductor may be made of other metal materials or metal compounds (e.g., WSi). Alternatively, the conductor may be made for example of polysilicon having a high affinity for the semiconductor material.

(e) The wiring layer of the present invention may be formed from other conductive materials instead of the n-type buried diffusion layer 3 that is an impurity diffusion layer. For example, the wiring layer may be a metal layer buried in the p-type silicon substrate 1.

(f) The upper end portions of the drain lead electrodes may be formed to protrude to a high position from the surface of the semiconductor substrate. This reduces the thickness of the layer in which the contact plugs are formed. In this case, the contact plugs may be shortened or eliminated, and the electrode portions may be connected directly to the metal wires.

(g) When the source diffusion layer 10 and the body diffusion layer 11 are formed after the trench grooves 7A and 7B are formed, the tolerance of the gate insulation film 8 may deteriorate. Thus, the trench grooves 7A and 7B may be formed after the source diffusion layer 10 and the body diffusion layer 11 are formed on the epitaxial silicon layer 5. This further improves the reliability of the semiconductor device.

(h) The above embodiments are intended to prevent electric field concentration at an edge formed on the upper end portion of a drain lead electrode when the drain lead electrode is formed by etching back. However, this problem also occurs when the drain lead electrode is formed by other methods. For example, when the drain lead electrode is formed by performing chemical mechanical polishing (CMP), a TiN layer located between a lead electrode and an insulation film recedes during a cleaning process to form an edge on an upper end portion of the lead electrode. As a result, electric field concentrates at the edge of the lead electrode in the same manner as when the drain lead electrode is formed by etching back. Thus, formation of the upper end portion of the lead electrode so that its edge protrudes from the surface of a semiconductor substrate results in the same advantages as described in the above embodiments.

(i) The conductive layer of the present invention may function as the drain electrodes instead of the source electrodes, and the conductor of the present invention may function as the source electrodes instead of the drain electrodes.

(j) Although only the vertical N-channel MOS transistor is formed in the single island region in the second embodiment, a vertical N-channel MOS transistor and a vertical NPN transistor may be formed simultaneously in other island regions in the same manner as described in the second embodiment.

(k) Although the upper portions of the drain lead electrodes are etched back in the above embodiments, the upper portions of the drain electrodes may be formed by performing CMP. In this case, the insulation film 14 or the silicon oxide film 41 may be used as a stopper. Thus, the edges of the drain lead electrodes can be formed to be higher than the semiconductor substrate surface.

(l) The present invention is applicable to, for example, a through-hole electrode. The through-hole electrode is formed to extend through a semiconductor substrate from the front surface of the semiconductor substrate toward a metal layer formed on the rear surface of the semiconductor substrate. The application of voltage to the through-hole electrode through-hole electrode would result in the same problem as the problem that is to be solved by the present invention. Thus, the application of the present invention to the through-hole electrode would suppress insulative damages.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a semiconductor substrate having a surface;
   a wiring layer buried in the semiconductor substrate;
   a conductor buried in the semiconductor substrate and made of a metallic material or polysilicon, with the conductor having a first end connected to the wiring layer and a second end exposed from the semiconductor substrate; and
   an insulation film arranged between the semiconductor substrate and the conductor, wherein the first end of the conductor extends into the wiring layer from an end of the insulation film and the second end of the conductor extends outward from the surface of the semiconductor substrate,
   wherein the wiring layer includes a groove that comes in contact with the first end of the conductor.

2. The semiconductor device according to claim 1, wherein the insulation film is in contact with the semiconductor substrate.

3. The semiconductor device according to claim 1, further comprising:
   a conductive layer formed on the semiconductor substrate, wherein current flows between the conductor, the wiring layer, the semiconductor substrate, and the conductive layer.

4. The semiconductor device according to claim 1, wherein:
   the insulation film, which has a surface, further covers the surface of the semiconductor substrate; and
   said part of the conductor is higher than the surface of the insulation film.

5. The semiconductor device according to claim 1, wherein the conductor has at least one first plane and at least one second plane that are alternately arranged adjacent to each other, with the adjacent first and second planes being angled from each other at an obtuse angle.

6. The semiconductor device according to claim 1, wherein the part of the conductor includes a curved surface.

7. A semiconductor device comprising:
   a semiconductor substrate;
   a wiring layer buried in the semiconductor substrate;
   a conductor buried in the semiconductor substrate, with the conductor having a first end connected to the wiring layer and a second end exposed from the semiconductor substrate; and
   an insulation film arranged between the semiconductor substrate and the conductor, wherein the conductor has at least one first plane and at least one second plane that are arranged adjacent to each other, with the second plane having a part that is not in contact with the insulation film, wherein the adjacent first and second planes of the conductor form therebetween an inflection point at which the adjacent first and second planes are angled from each other at an obtuse angle.

8. The semiconductor device according to claim 7, wherein the insulation film is in contact with the semiconductor substrate.

9. The semiconductor device according to claim 7, further comprising:
   a conductive layer formed on the semiconductor substrate, wherein current flows between the conductor, the wiring layer, the semiconductor substrate, and the conductive layer.

10. The semiconductor device according to claim 7, wherein the conductor includes a curved upper surface.

11. The semiconductor device according to claim 7, wherein the wiring layer includes a groove that comes in contact with part of the conductor.

12. A semiconductor device comprising:
    a semiconductor substrate having a surface;
    a wiring layer buried in the semiconductor substrate;
    a conductor buried in the semiconductor substrate, with the conductor having a first end connected to the wiring layer and a second end exposed from the semiconductor substrate;
    a gate electrode buried in the semiconductor substrate, wherein a part of the semiconductor substrate is arranged between the conductor and the gate electrode; and
    an insulation film arranged between the semiconductor substrate and the conductor, wherein the second end of the conductor extends outward from the surface of the semiconductor substrate,
    wherein the wiring layer includes a groove that comes in contact with the first end of the conductor.

13. The semiconductor device according to claim 12, further comprising:

a conductive layer formed on the semiconductor substrate, wherein current flows between the conductor, the wiring layer, the semiconductor substrate, and the conductive layer.

14. The semiconductor device according to claim 12, wherein:
   the insulation film, which has a surface, further covers the surface of the semiconductor substrate; and
   said part of the conductor is higher than the surface of the insulation film.

15. The semiconductor device according to claim 12, wherein the conductor has at least one first plane and at least one second plane that are alternately arranged adjacent to each other, with the adjacent first and second planes being angled from each other at an obtuse angle.

16. The semiconductor device according to claim 12, wherein the part of the conductor includes a curved surface.

* * * * *